(12) United States Patent
Li et al.

(10) Patent No.: US 10,200,189 B1
(45) Date of Patent: Feb. 5, 2019

(54) DUAL-MODE LOW-POWER LOW-JITTER NOISE PHASED LOCKED LOOP SYSTEM

(71) Applicants: Qiang Li, Irvine, CA (US); Chen Chen, Irvine, CA (US)

(72) Inventors: Qiang Li, Irvine, CA (US); Chen Chen, Irvine, CA (US)

(73) Assignee: SPATIALLINK CORPORATION, Irvine, CA (US)

( * ) Notice: Subject to any disclaimer, the term of this patent is extended or adjusted under 35 U.S.C. 154(b) by 0 days.

(21) Appl. No.: 15/605,220

(22) Filed: May 25, 2017

Related U.S. Application Data (60) Provisional application No. 62/341,284, filed on May 25, 2016.

(51) Int. Cl.
| | | |
|---|---|---|
| *H04L 7/033* | (2006.01) | |
| *H02M 3/07* | (2006.01) | |
| *H03L 7/08* | (2006.01) | |
| *H03L 7/093* | (2006.01) | |

(52) U.S. Cl.
CPC ............ *H04L 7/0331* (2013.01); *H02M 3/07* (2013.01); *H03L 7/0802* (2013.01); *H03L 7/093* (2013.01)

(58) Field of Classification Search
CPC ....... H04L 7/0331; H03L 7/00; H03L 7/0802; H03L 7/06; H03L 7/08; H03L 7/093; H02M 3/07; H02M 11/00
USPC ..... 331/16; 327/103, 66, 563; 330/250, 253, 330/254, 255, 257, 261, 277, 278, 284, 330/288; 375/354, 355, 373, 374, 375, 375/376
See application file for complete search history.

(56) References Cited

U.S. PATENT DOCUMENTS

| | | | | |
|---|---|---|---|---|
| 5,414,741 | A * | 5/1995 | Johnson ................. | H03D 3/245 331/18 |
| 6,124,741 | A * | 9/2000 | Arcus ................... | H03L 7/0895 326/83 |
| 6,624,668 | B1 * | 9/2003 | Robinson ................ | H03L 7/087 327/103 |
| 7,149,914 | B1 * | 12/2006 | Asaduzzaman ......... | H03L 7/087 713/500 |
| 8,073,416 | B2 * | 12/2011 | Sun ........................ | H03J 7/065 331/18 |

(Continued)

*Primary Examiner* — Siu Lee (57) ABSTRACT

A Dual-mode forward path PLL system and method are disclosed. The forward path PLL system includes a phase frequency detector (PFD) circuit including a first input node a second input node, a first output node a second output node, where the PFD receives a first input signal, a second input signal and generates a first output signal and second output signal, and where the first input signal is a reference frequency signal and the second input signal is a divided frequency value signal, a charge pump circuit including a third input node, a fourth input node and a third output node, where the third input node and the fourth input node are coupled to the first output node and the second output node of the PFD and where the Charge pump is programmable; and a loop filter circuit including a fifth input node and fourth output node, where the fifth input node is coupled to the third output node of the charge pump and where the loop filter circuit is programmable. In some aspects, the up-side switch and the down-side switch are current sources and the divided frequency value is signal is a fractional frequency value signal.

11 Claims, 5 Drawing Sheets

(56) References Cited

U.S. PATENT DOCUMENTS

2006/0238261 A1* 10/2006 Rhee .................. H03L 7/0898
331/16
2008/0278222 A1* 11/2008 Conte .................. H02M 3/073
327/536

* cited by examiner

DUAL-MODE LOW-POWER LOW-JITTER NOISE PHASED LOCKED LOOP SYSTEM

CROSS REFERENCE TO RELATED APPLICATIONS

The present disclosure claims the benefit of U.S. Provisional Application No. 62/341,284; filed on May 25, 2016; and entitled PHASE LOCK LOOP (PLL) FOR INTERNET OF THINGS (IOT) SYSTEM ON CHIP (SOC), which is hereby incorporated by reference in its entirety for all purposes.

The entire contents of the following applications are incorporated herein by reference: U.S. Nonprovisional patent application Ser. No. 15/253,067; filed on Aug. 31, 2016; and entitled HYBRID SOURCE OF ENERGY SUPPLY SCHEME FOR INTERNET OF THINGS SYSTEM ON CHIP. U.S. Nonprovisional patent application Ser. No. 15/253,196; filed on Aug. 31, 2016; and entitled AUTONOMOUS BANDWIDTH SELECT WIRELESS TRANSCEIVER and U.S. Nonprovisional patent application Ser. No. 15/253,269; filed on Aug. 31, 2016; and entitled POWER MODE MANAGEMENT.

TECHNICAL FIELD

The present disclosure generally relates to wireless system Phased locked loops system and in particular to a dual-mode, low-power, low-jitter phased locked loop (PLL) system.

BACKGROUND

Increasingly wireless systems are evaluated on their power consumption capabilities. A low-power consumption wireless system is highly desired since this generally translates directly to a longer battery life of a wireless device or power consumption in general of the wireless system. Phased Locked Loop (PLL) systems are no exception. Some of the metrics to evaluate PLLs are power consumption and low-jitter noise. It is highly desired to have low-power consumption and low-jitter noise PLLs and even more so for Internet of Things (IoT) systems. Accordingly, there is a need in the art for a PLL with low-power consumption and low-jitter noise for IoT devices and systems of chip (SoC).

SUMMARY

The disclosed subject matter relates to a voltage controlled oscillator system. The forward path phased locked loop (PLL) system includes a phase frequency detector (PFD) circuit including a first input node a second input node, a first output node a second output node, where the PFD receives a first input signal, a second input signal and generates a first output signal and second output signal, and where the first input signal is a reference frequency signal and the second input signal is a divided frequency value signal, a charge pump circuit including a third input node, a fourth input node and a third output node, where the third input node and the fourth input node are coupled to the first output node and the second output node of the PFD and where the Charge pump is programmable; and a loop filter circuit including a fifth input node and fourth output node, where the fifth input node is coupled to the third output node of the charge pump and where the loop filter circuit is programmable. In some aspects, the up-side switch and the down-side switch are current sources and the divided frequency value is signal is a fractional frequency value signal.

The disclosed subject matter further relates to a method to operate a dual mode PLL including selecting a first operational mode, where the first operational mode is based on a wireless protocol, programming the bandwidth of a loop filter circuit of a PLL circuit based on the selecting of the first operational mode, selecting a second operational mode, where the second operational mode is based on a wireless protocol, and reprogramming the bandwidth of the loop filter circuit of the PLL circuit based on the selecting of the second operational mode. In some aspects, selecting a channel within the first operational mode or the second operational mode requires programming a charge pump of the PLL to maintain constant bandwidth of the PLL wherein programming the charge pump comprises changing bias current of the charge pump.

It is understood that other configurations of the subject technology will become readily apparent to those skilled in the art from the following detailed description, wherein various configurations of the subject technology are shown and described by way of illustration. As will be realized, the subject technology of other different configurations and its several details are capable of modifications in various other respects, all without departing from the subject technology. Accordingly, the drawings and the detailed description are to be regarded as illustrative in nature and not restrictive.

BRIEF DESCRIPTION OF DRAWINGS

Certain features of the present disclosure are set forth in the appended claims. However, for purpose of explanation, several implementations of the present disclosure are set forth in the following figures.

Embodiments of the present disclosure and their advantages are best understood by referring to the detailed description that follows. It should be appreciated that like-reference-numerals are used to identify like-elements illustrated in one or more of the figures.

DETAILED DESCRIPTION

The detailed description includes specific details for the purpose of providing a thorough understanding of the present disclosure. However, the present disclosure is not limited to the specific details set forth herein and may be practiced without these specific details. In some instances, structures and components are shown in block diagram form to avoid obscuring the concept of the present disclosure.

In one or more implementations, the subject technology facilitates a charge pump circuit and a loop filter circuit on a forward path PLL for internet of things (IoT) system on chip (SoC). In some aspects, the charge pump circuit includes an up-side switch, a down-side switch, a pair of gate capacitors, and a tunable bias circuit. The charge pump circuit further includes a first field effect transistor (FET) (M7) coupled to a supply circuit and a second FET (M10) coupled to a ground node of the charge pump circuit and a plurality of FETs (M1-M6) and where disconnecting the pair of gate capacitors reduces the noise from the plurality of the FETs. In at least one embodiment, the loop filter circuit includes tunable components and where the components are at least one of a resistor, an inductor or a capacitor and where the loop filter circuit is a passive circuit including passive tunable components. In one or more implementations, the loop filter circuit is a third order loop filter.

In another embodiment, programming the loop filter circuit configures the forward path PLL system into a first operational mode and a second operational mode, where the first operational mode is a Bluetooth protocol and the second operational mode is a Wi-Fi protocol and where configuring the PLL system into the first operational mode or the second operational mode requires modifying the overall bandwidth of the PLL system.

Figure 1:
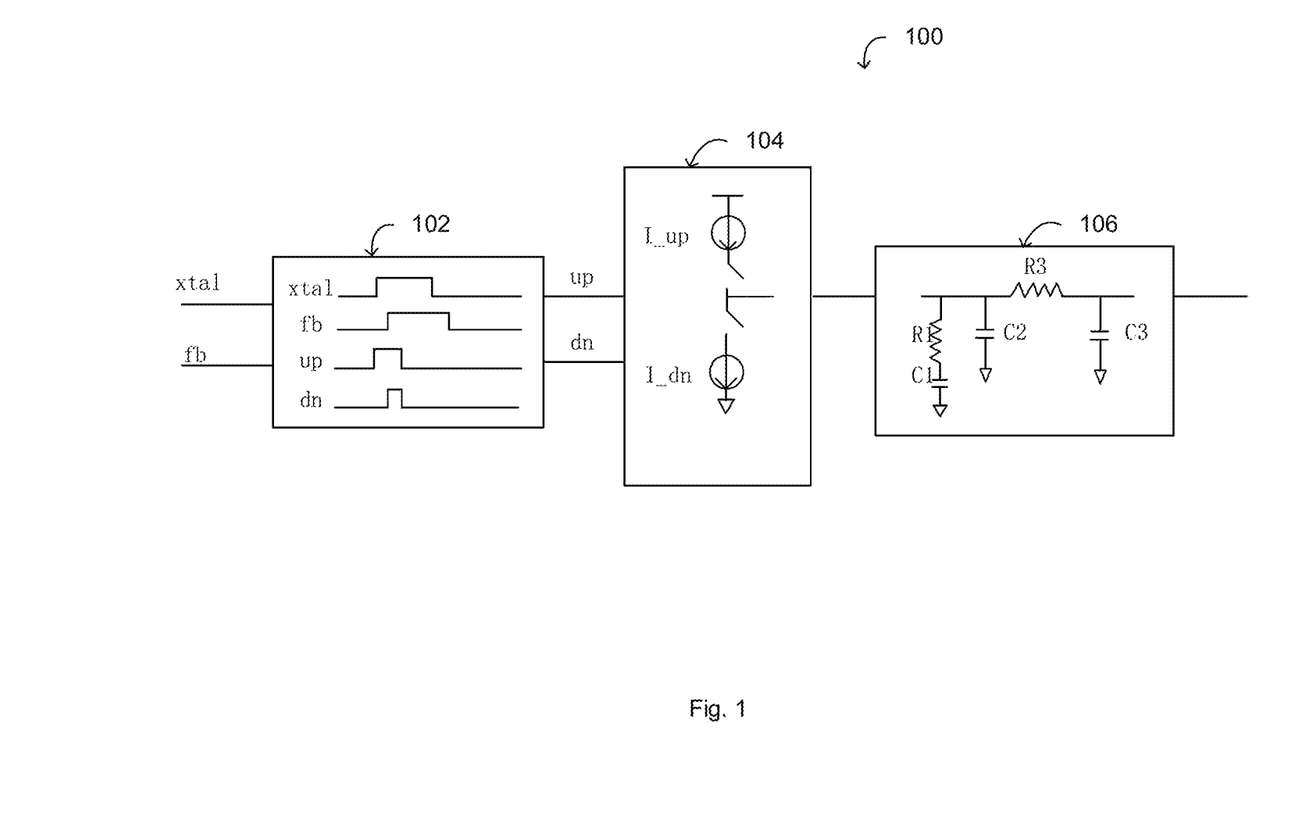
FIG. 1 illustrates an exemplary block diagram of forward path of a phased locked loop in accordance with one or more embodiments of the present disclosure.

FIG. 1 illustrates an exemplary block diagram of forward path of a phased locked loop 100 in accordance with one or more embodiments of the present disclosure. Forward path of a phased locked loop 100 includes a phase frequency detector (PFD) circuit 102, a charge pump circuit 104 and a loop filter circuit 106. The exemplary block diagram of the forward path of the phased locked loop 100 is an example by way of illustration only and not by way of limitation. Skilled artisans may implement the described technology of the present disclosure in varying way, but such implementation decisions should not be interpreted as causing a departure from the scope of the present disclosure.

The tunable/programmable charge pump 104 employs a switch capacitor technique to aid in improving phase noise of the PLL circuit. In other aspects of the technology, the PFD circuit 102 compares the phase of two input signals (a reference frequency signal and a divided frequency value signal). The two input signals may correspond to two different input signals, usually one from a voltage controlled oscillator (fb) and another from some external source (xtal) (e.g., a crystal oscillator). The PFD 102 circuit has two outputs (up and dn) which instruct subsequent circuitry on how to adjust to lock onto the phase. To form a phase-locked loop (PLL) the PFD phase error output is fed to a loop filter circuit 106 which may integrate the signal to smooth the signal. The smoothed signal is fed to a voltage-controlled oscillator (VCO) (not shown) which generates an output signal with a frequency that is proportional to the input voltage. The VCO output is also fed back (fb) to the PFD to form a PLL circuit.

Figure 2:
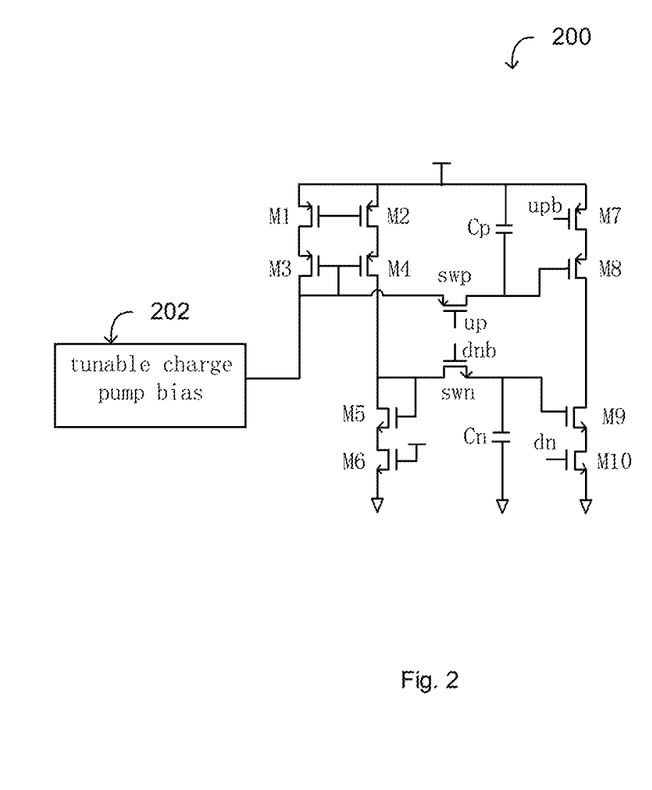
FIG. 2 illustrates an exemplary block of a charge pump circuit in accordance with one or more embodiments of the present disclosure.

FIG. 2 illustrates an exemplary block of a charge pump circuit 200 in accordance with one or more embodiments of the present disclosure. As depicted in FIG. 2, the charge pump circuit 104 may include an up-side switch (swp), a down-side switch (swn), gate capacitors (Cp and Cn) and a tunable/programmable charge pump bias circuit 202. In one or more implementations, the down-side switch and the up-side switch are current sources. The exemplary block diagram of the charge pump circuit 200 is an example by way of illustration only and not by way of limitation. Skilled artisans may implement the described technology of the present disclosure in varying way, but such implementation decisions should not be interpreted as causing a departure from the scope of the present disclosure.

In some aspects. The tunable/programmable charge pump bias circuit 202 aid in changing the value of the two current sources (M8 and M9) by programming the tunable/programmable charge pump bias circuit 202 to different bias values resulting in changing the current values of current sources M8 and M9. Programming the charge pump bias circuit 202 aids in keeping the bandwidth of the PLL fixed when changing channels within the same protocol (e.g., Bluetooth). The bandwidth (BW) of the PLL is governed by the equation: $BW=Icp*R1*Kvco/N$ where R1 (resistance) and Kvco (VCO gain) are constants, Icp is the charge pump current value and N is the frequency divider ratio N. In one or more implementations, to achieve low current noise and low random variations resulting from variations in process or temperature or voltage, large size devices may be used.

In operation, the gate capacitors (Cp and Cn) are connected when the two current sources (M8 and M9) are ON, to reduce the drift of Icp and the current noise coming from biasing devices (M1-M6). In one or more implementations, (swp and Cp) and (swn and Cn) forms switch cap configuration. M8 and M9 acts like up and down tail current source. When M8/M9 is ON, the swp/swn is OFF, thus disconnect the M8/M9 from biasing devices (M1-M6). At the same time the Cp/Cn hold the bias voltage for M8/M9. When M8/M9 is OFF, the swp/swn is ON, and the biasing devices (M1-M6) will recharge Cp/Cn to their certain level, allow them prepare for the next operation. In one or more implementations, switch devices M7 and M10 are placed at the supply and ground side respectively of the charge pump circuit 200 to reduce the effect of charge pump 200 injection. In some aspects one or more of devices M1-M10 are implemented as field effect transistors (FETs).

Figure 3:
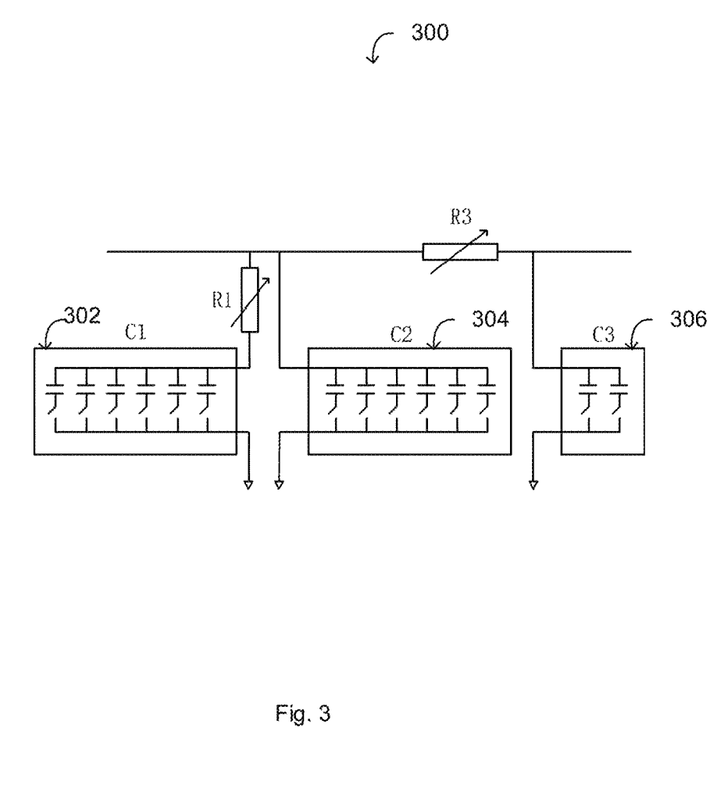
FIG. 3 illustrates an exemplary block of a loop filter circuit in accordance with one or more embodiments of the present disclosure.

FIG. 3 illustrates an exemplary block of a loop filter circuit 300 in accordance with one or more embodiments of the present disclosure. In one or more implementations, the loop filter circuit 300 is a third order loop filter. The loop filter circuit 300 includes a tunable/programmable resistor R1, a tunable/programmable capacitance C1, a second tunable/programmable capacitance C2, second tunable/programmable resistor R3 and third tunable/programmable capacitance C3. The exemplary block diagram of the loop filter circuit 300 is an example by way of illustration only and not by way of limitation. Skilled artisans may implement the described technology of the present disclosure in varying way, but such implementation decisions should not be interpreted as causing a departure from the scope of the present disclosure.

As depicted in FIG. 3, the loop filter circuit 300 configuration where all the passive components values (tunable/programmable resistor R1, a tunable/programmable capacitance C1, a second tunable/programmable capacitance C2, second tunable/programmable resistor R3 and third tunable/programmable capacitance C3) are tunable/programmable, programming the passive components may improve high band phase noise and suppress spurs coming from other PLL circuitry such as a fractional frequency divider. According to aspects of the technology, a tunable/programmable loop filter circuit is configured to operate in two different modes (e.g., a first operational mode and a second operational mode) where each operational mode represents a different wireless protocol (e.g., Bluetooth and Wi-Fi).

In operation, the output signals from FPD circuit 102 are feed to the charge pump 104 to control the upside current source and the downside current source resulting in charging or discharging the loop filter circuit 106. The goal is to tune/program the charge pump circuit 104 and loop filter circuit 106 to operate the PLL circuit in two different operational modes. For example, in a Bluetooth operational mode, a small bandwidth is needed to improve the close-in phase noise due to fractional operation of a frequency divider. In other aspects, in Wi-fi operational mode, the bandwidth is tuned to be higher value in comparison to the Bluetooth bandwidth since better fan-out phase noise is needed to help improving the performance metric of a transceiver (e.g., Error Vector Magnitude (EVM)). Accordingly, the resultant bandwidth of the forward path PLL is selected base on the operational mode, while maintaining low power consumption.

Figure 4:
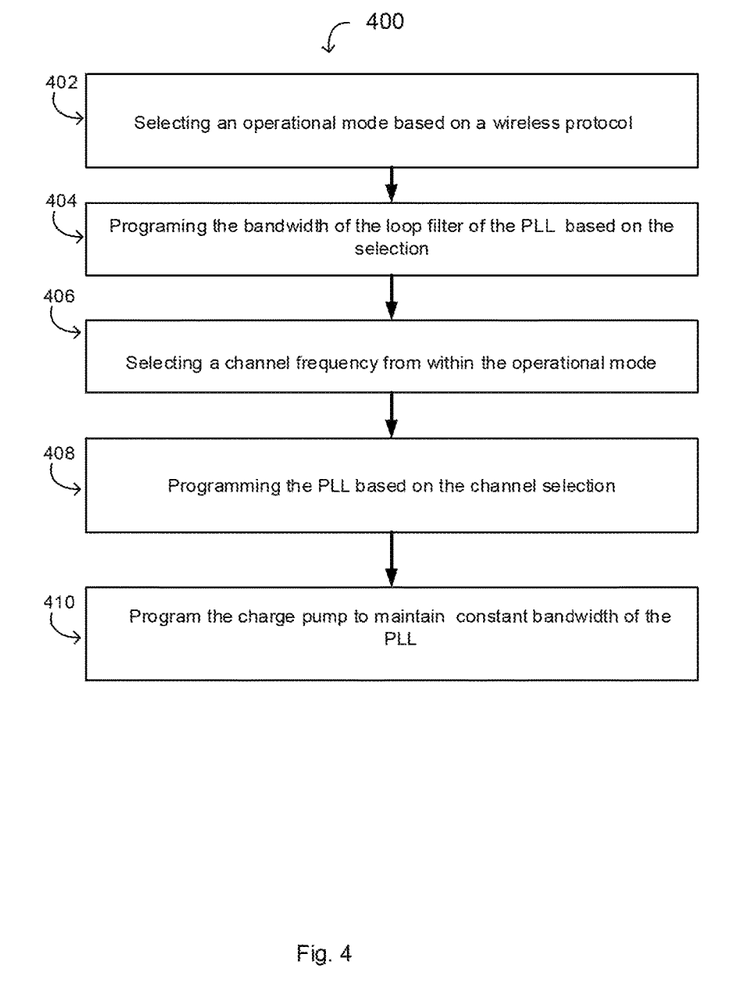
FIG. 4 illustrates a flowchart of an example process for operating the exemplary forward path of the phased locked loop in accordance with one or more embodiments of the present disclosure.

FIG. 4 illustrates a flowchart of an example process for operating the exemplary forward path of the phased locked loop 400 in accordance with one or more embodiments of the present disclosure. For explanatory purposes, the blocks of the example process for operating the exemplary forward path of the phased locked loop 400 is described herein as occurring in serial, or linearly. However, multiple blocks of the example process 400 may occur in parallel. In addition, the blocks of the example process 400 may be performed a different order than the order shown.

The output signals from frequency and phase detector 102 are feed to the charge pump 104 to control the upside current source and the downside current source resulting in charging or discharging the loop filter circuit 106. The goal is to tune/program the charge pump circuit 104 and loop filter circuit 106 to operate the PLL circuit in two different operational modes. For example, in a Bluetooth operational mode, a small bandwidth is needed to improve the close-in phase noise due to fractional operation of frequency divider. In other aspects, in Wi-fi operational mode, the bandwidth is tuned to be higher value in comparison to the Bluetooth bandwidth since better fan-out phase noise is needed to help improving the performance metric of a transceiver (e.g., Error Vector Magnitude (EVM)). Accordingly, the resultant bandwidth of the forward path PLL is selected base on the operational mode, while maintaining low power consumption.

In one or more implementations, a transceiver is programmed to operate under a specified protocol (e.g., wireless protocols). Dual mode transceivers are designed to be configured to operate in different operational modes (e.g., the Bluetooth protocol and/or the WiFi protocol). At block 402 once the transceiver is determined to work in a specific protocol, a selection of operational mode based on the wireless protocol is finalized. Based on the selection of the wireless protocol the loop filter circuit 106 of the PLL is programmed to have a bandwidth to help operate under the wireless protocol of choice as shown in block 404.

In some aspects, once the loop filter circuit 106 is programmed to reflect the desired bandwidth of the wireless protocol of interest, as shown in block 406, a selection of a channel within the wireless protocol of interest is determined (e.g., Channel=5 (2407 MHz) from the Bluetooth protocol). At block 408, programming the PLL to the selected Channel (Channel=5) will alter the over all bandwidth of the PLL and an adjustment to the resultant bandwidth of the PLL is required. At block 410, the charge pump 104 is programmed to accommodate for changing the channel within the wireless protocol of interest and to maintain a constant over all bandwidth of the PLL.

Figure 5:
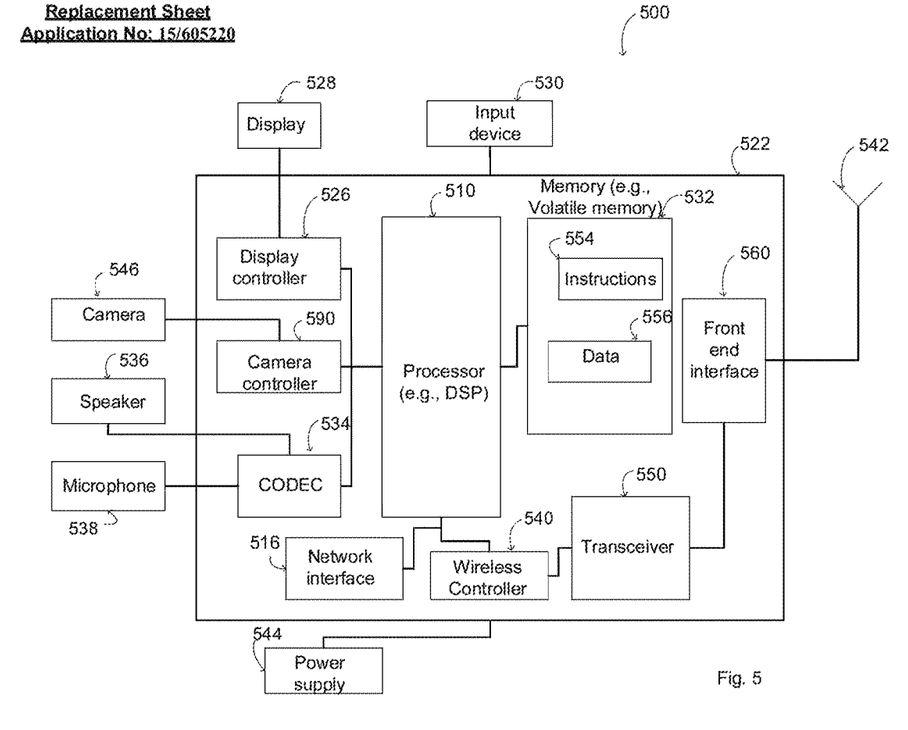
FIG. 5 illustrates conceptually an example electronic system with which some implementations of the present disclosure may be implemented.

FIG. 5 illustrates conceptually an example electronic system 500 with which some implementations of the present disclosure may be implemented. Electronic system 500 may be a gateway device, a set-top box, a computer (e.g., desktop computer or laptop computer), a phone, a personal digital assistant (PDA), a server, a switch, a router, a base station, a receiver, or any other sort of electronic device that transmits signals over a network, such as electronic devices embedded in smart appliances and other smart systems. The electronic system 500 may be, and/or may be a part of, the proxy device and/or one or more of the smart devices. For example, the electronic system 500 may be a sensor, an active device, and/or an actuator. Such an electronic system includes various types of computer readable media and interfaces for various other types of computer readable media.

The electronic system 500 may include a processor 510, such as a digital baseband 140. The processor 510 may be coupled to a computer-readable storage medium, such as a memory 532 (e.g., a non-transitory computer-readable medium), via a transceiver 550. The transceiver 550 may include a path PLL system as depicted in FIG. 1. Moreover, as depicted in FIG. 5, the processor 510 may be external transceiver 550. For example, the processor 510 may be "off-chip" with respect to the transceiver 550. In another embodiment, the processor 510 and the transceiver 550 are integrated within a system-in-package or system-on-chip device 522, as explained further below.

The memory 532 may store instructions 554 that are executable by the processor 510, data 556 that is accessible to the processor 510, or a combination thereof. In a particular embodiment, the memory 532 is a volatile memory that is accessible to the processor via transceiver 550. FIG. 5 also shows a display controller 526 that is coupled to the processor 510 and to a display 528. A coder/decoder (CODEC) 534 may also be coupled to the processor 510. A speaker 536 and a microphone 538 may be coupled to the CODEC 534. FIG. 5 also indicates that a wireless controller 540 may be coupled to the processor 510. The wireless controller may be further coupled to an antenna 542 via a transceiver 550. A camera 546 may be coupled to a camera controller 590. The camera controller 590 may be coupled to the processor 510.

In a particular embodiment, the processor 510, the memory 532, the display controller 526, the camera controller 590, the CODEC 534, the wireless controller 540, and the transceiver 550 are included in the system-in-package or system-on-chip device 522. An input device 530 and a power supply 544 may be coupled to the system-on-chip device 522. Moreover, in a particular embodiment, and as illustrated in FIG. 5, the display 528, the input device 530, the camera 546, the speaker 536, the microphone 538, the antenna 542, and the power supply 544 are external to the system-on-chip device 522. However, each of the display 528, the input device 530, the camera 546, the speaker 536, the microphone 538, the antenna 542, and the power supply 544 may be coupled to a component of the system-on-chip device 522. As a particular example, the processor 510 and the memory 532 are coupled to transceiver 550.

In connection with the present disclosure, a computer-readable storage medium (e.g., the memory 532) stores data (e.g., the data 556) that is accessible to a processor (e.g., the processor 510) during modes of operation of transceiver 550. The data 556 may be a method instructions as depicted in FIG. 4. The method instructions are executable by processor 510, where the instructions include steps on how to operate and configure the transceiver 550. Finally, as shown in FIG. 5, electronic system 500 couples to a network through a network interface 516. In this manner, the electronic system 500 may be a part of a network of computers (for example, a local area network (LAN), a wide area network (WAN), or an Intranet, or a network of networks, for example, the Internet. Any or all components of electronic system 500 may be used in conjunction with the subject disclosure. The network interface 516 may include cellular interfaces, WiFi interfaces, Infrared interfaces, RFID interfaces, ZigBee interfaces, Bluetooth interfaces, Ethernet interfaces, coaxial interfaces, optical interfaces, or generally any communication interface that may be used for device communication.

Those of skill in the art will appreciate that the foregoing disclosed systems and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are separated into semiconductor dies and packaged into semiconductor chips. The semiconductor chips are then employed in devices, such as, an IoT system, the electronic system 500, or a combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor, and the storage medium may reside as discrete components in a computing device or user terminal.

Further, specific details are given in the description to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Where applicable, various embodiments provided by the present disclosure may be implemented using hardware, software, or combinations of hardware and software. In addition, where applicable, the various hardware components and/or software components, set forth herein, may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer-readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device. As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the present disclosure, the disclosure, the present disclosure, other variations thereof and alike are for convenience and do not imply that a disclosure relating to such phrase(s) is essential to the present disclosure or that such disclosure applies to all configurations of the present disclosure. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A forward path phased locked loop (PLL) system comprising:
    a phase frequency detector (PFD) circuit comprising a first input node a second input node, a first output node a second output node, wherein the PFD receives a first input signal, a second input signal and generates a first output signal and second output signal, wherein the first input signal is a reference frequency signal and the second input signal is a divided frequency value signal;
    a charge pump circuit comprising a third input node, a fourth input node and a third output node, wherein the third input node and the fourth input node are coupled to the first output node and the second output node of the PFD and wherein the Charge pump is programmable;
    a loop filter circuit comprising a fifth input node and fourth output node, wherein the fifth input node is coupled to the third output node of the charge pump and wherein the loop filter circuit is programmable;
    wherein the charge pump circuit comprises an up-side switch, a down-side switch, a pair of gate capacitors, and a tunable bias circuit;
    wherein the up-side switch and the down-side switch are current sources;
    wherein the charge pump circuit further comprises a first field effect transistor (FET) (M7) coupled to a supply circuit and a second FET (M10) coupled to a ground node of the charge pump circuit;
    wherein the charge pump circuit further comprises a plurality of FETs (M1-M6) and wherein connecting the pair of gate capacitors reduces the noise from the plurality of the FETs.

2. The forward path phased locked loop (PLL) system of claim 1, wherein the loop filter circuit comprises tunable components and wherein the tunable components are at least one of a resistor, an inductor or a capacitor.

3. The forward path phased locked loop (PLL) system of claim 2, wherein the loop filter circuit is a passive circuit comprising passive tunable components.

4. The forward path phased locked loop (PLL) system of claim 1, wherein the loop filter circuit is a third order loop filter.

5. The forward path phased locked loop (PLL) system of claim 1, wherein the divided frequency value is a fractional frequency value signal.

6. The forward path phased locked loop (PLL) system of claim 1, wherein programming the loop filter circuit configures the forward path PLL system into a first operational mode and a second operational mode.

7. The forward path phased locked loop (PLL) system of claim 6, wherein the first operational mode is a Bluetooth protocol and the second operational mode is a Wi-Fi protocol.

8. The forward path phased locked loop (PLL) system of claim 7, wherein configuring the PLL system into the first operational mode or the second operational mode requires modifying the overall bandwidth of the PLL system.

9. A method to operate a dual mode PLL, comprising:
    selecting a first operational mode, wherein the first operational mode is based on a wireless protocol;
    programming the bandwidth of a loop filter circuit of a PLL circuit based on the selecting of the first operational mode;
    selecting a second operational mode, wherein the second operational mode is based on a wireless protocol; and
    reprogramming the bandwidth of the loop filter circuit of the PLL circuit based on the selecting of the second operational mode;
    wherein a charge pump circuit coupled to the loop filter circuit comprises an up-side switch, a down-side switch, a pair of gate capacitors, and a tunable bias circuit;
    wherein the up-side switch and the down-side switch are current sources;
    wherein the charge pump circuit further comprises a first field effect transistor (FET) (M7) coupled to a supply circuit and a second FET (M10) coupled to a ground node of the charge pump circuit;
    wherein the charge pump circuit further comprises a plurality of FETs (M1-M6) and wherein connecting the pair of gate capacitors reduces noise from the plurality of the FETs.

10. The method of claim 9, wherein selecting a channel within the first operational mode or the second operational mode requires programming a charge pump of the PLL to maintain constant bandwidth of the PLL.

11. The method of claim 10, wherein programming the charge pump comprises changing bias current of the charge pump.

* * * * *